US009171715B2

(12) United States Patent
Matero (10) Patent No.: US 9,171,715 B2
(45) Date of Patent: Oct. 27, 2015

(54) ATOMIC LAYER DEPOSITION OF $GEO_2$

(71) Applicant: ASM IP HOLDING B.V., Almere (NL)

(72) Inventor: Raija H. Matero, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 13/802,393

(22) Filed: Mar. 13, 2013

(65) Prior Publication Data

US 2014/0065841 A1     Mar. 6, 2014

Related U.S. Application Data

(60) Provisional application No. 61/697,007, filed on Sep. 5, 2012, provisional application No. 61/713,082, filed on Oct. 12, 2012.

(51) Int. Cl.
| | |
|---|---|
| *H01L 21/00* | (2006.01) |
| *H01L 21/02* | (2006.01) |
| *C23C 16/40* | (2006.01) |
| *C23C 16/455* | (2006.01) |
| *H01L 29/78* | (2006.01) |

(52) U.S. Cl.
CPC .......... *H01L 21/02112* (2013.01); *C23C 16/40* (2013.01); *C23C 16/45525* (2013.01); *H01L 21/0228* (2013.01); *H01L 29/785* (2013.01)

(58) Field of Classification Search
CPC ...................... H01L 21/0228; H01L 21/02112; H01L 29/785; C23C 16/45525; C23C 16/40
USPC ........................................................ 438/778
See application file for complete search history.

(56) References Cited

U.S. PATENT DOCUMENTS

| | | | |
|---|---|---|---|
| 5,766,999 A | 6/1998 | Sato et al. | |
| 6,235,568 B1 | 5/2001 | Murthy et al. | |
| 6,475,865 B1 | 11/2002 | Yang et al. | |
| 6,537,370 B1 | 3/2003 | Hernandez et al. | |
| 6,620,743 B2 | 9/2003 | Pagliaro, Jr. et al. | |
| 6,749,687 B1 | 6/2004 | Ferro et al. | |
| 6,960,537 B2 | 11/2005 | Shero et al. | |
| 7,108,748 B2 | 9/2006 | Brabant et al. | |
| 7,238,595 B2 | 7/2007 | Brabant et al. | |
| 7,312,165 B2 | 12/2007 | Jursich et al. | |
| 7,329,593 B2 | 2/2008 | Bauer et al. | |
| 2003/0036268 A1 | 2/2003 | Brabant et al. | |
| 2003/0080394 A1 | 5/2003 | Babcock et al. | |

(Continued)

OTHER PUBLICATIONS

Perego et al., "Fabrication of GeO2 layers using a divalent Ge precursor," Applied Physics Letters 90, 2007.

*Primary Examiner* — Colleen A Matthews
*Assistant Examiner* — Quovaunda V Jefferson
(74) *Attorney, Agent, or Firm* — Knobbe Martens Olson & Bear LLP (57) ABSTRACT

Atomic layer deposition processes for forming germanium oxide thin films are provided. In some embodiments the ALD processes can include the following: contacting the substrate with a vapor phase tetravalent Ge precursor such that at most a molecular monolayer of the Ge precursor is formed on the substrate surface; removing excess Ge precursor and reaction by products, if any; contacting the substrate with a vapor phase oxygen precursor that reacts with the Ge precursor on the substrate surface; removing excess oxygen precursor and any gaseous by-products, and repeating the contacting and removing steps until a germanium oxide thin film of the desired thickness has been formed.

19 Claims, 9 Drawing Sheets

(56) References Cited

U.S. PATENT DOCUMENTS

| | | |
|---|---|---|
| 2004/0137167 A1 | 7/2004 | Nguyen |
| 2004/0151845 A1 | 8/2004 | Nguyen et al. |
| 2005/0192193 A1* | 9/2005 | Korzenski et al. ............ 510/175 |
| 2005/0266700 A1* | 12/2005 | Jursich et al. ................ 438/785 |
| 2007/0117335 A1 | 5/2007 | Sandhu et al. |
| 2007/0155138 A1 | 7/2007 | Tomasini et al. |
| 2009/0203197 A1 | 8/2009 | Hanawa et al. |
| 2011/0117732 A1 | 5/2011 | Bauer et al. |
| 2012/0009802 A1 | 1/2012 | LaVoie et al. |
| 2012/0028454 A1 | 2/2012 | Swaminathan et al. |
| 2012/0244688 A1 | 9/2012 | Bauer et al. |
| 2013/0045374 A1* | 2/2013 | Yu et al. ........................ 428/220 |

\* cited by examiner

FIG. 1

Mean thickness 34.7 nm
Range 4.23 nm
NU 3.4%

Mean thickness 16.7 nm
Range 0.82 nm
NU 1.3%

ATOMIC LAYER DEPOSITION OF GEO$_2$

CROSS-REFERENCE TO RELATED APPLICATIONS

This application claims the benefit of U.S. Provisional Patent Application Ser. No. 61/697,007, filed Sep. 5, 2012, entitled "ATOMIC LAYER DEPOSITION OF GeO$_2$," and U.S. Provisional Patent Application Ser. No. 61/713,082, filed Oct. 12, 2012, entitled "ATOMIC LAYER DEPOSITION OF GeO$_2$." The contents of all the above-referenced applications are incorporated herein by reference in their entireties.

BACKGROUND OF THE INVENTION

1. Field of the Invention

The application relates to atomic layer deposition processes for forming GeO$_2$ films.

2. Background

Ge devices are of interest because of Ge high hole mobility. Low D$_{it}$ interface formation with HfO$_2$ HK material will allow for good Ge based FinFETs.

SUMMARY

According to some embodiments of the present disclosure, atomic layer deposition processes for forming germanium oxide thin films on a substrate in a reaction chamber are disclosed. The ALD processes can include contacting the substrate with a vapor phase tetravalent Ge precursor, removing excess Ge precursor and any reaction by-products, contacting the substrate with a vapor phase oxygen precursor, removing excess oxygen precursor and any gaseous by-products, and repeating the contacting and removing steps until a germanium oxide thin film of the desired thickness has been formed. In some embodiments, contacting the substrate with a vapor phase tetravalent Ge precursor results in the formation of at most a molecular monolayer of the Ge precursor on the substrate surface. In some embodiments, the oxygen precursor reacts with the Ge precursor on the substrate surface.

According to some embodiments of the present disclosure, in an ALD process for forming a germanium oxide thin film using a Ge precursor and an oxygen precursor, removing excess Ge precursor comprising removing excess Ge precursor from the substrate surface and in the proximity of the substrate surface. In some embodiments, the oxygen precursor is something other than water. In some embodiments, the oxygen precursor is one of ozone, oxygen atoms, oxygen radicals, or oxygen plasma. In some embodiments, the Ge-precursor is not a halide. In some embodiments, the Ge-precursor comprises at least one alkoxide ligand. In some embodiments, the Ge-precursor comprises at least one amine or alkylamine ligand. In some embodiments, the Ge-precursor comprises at least one amine or alkylamine ligand, and the oxygen precursor comprises water.

According to some embodiments of the present disclosure, in an ALD process for forming a germanium oxide thin film on a substrate, the surface of the substrate comprises a thin layer of GeO$_2$ prior to beginning the ALD process. In some embodiments, the substrate is pretreated with a passivation chemical to prevent oxidation before the germanium oxide film is deposited. In some embodiments, an interfacial layer is formed on the substrate before the germanium oxide thin film is deposited. In some embodiments, the deposition temperature is from about 100° C. to about 400° C. In some embodiments, the substrate is treated to remove native Ge oxide prior to forming the germanium oxide thin film.

Some embodiments for forming a germanium oxide thin film by an ALD process include depositing a thin layer of a different material over the germanium oxide thin film. In some embodiments, the thin layer of a different material is deposited directly on the germanium oxide thin film. In some embodiments, the thin layer comprises Al$_2$O$_3$, and in some embodiments, the Al$_2$O$_3$ layer is deposited by a process that does not use water as a reactant. In some embodiments, the germanium oxide thin film serves as an interlayer between the substrate and a high-k layer. And in some embodiments, the germanium oxide thin film may be used in a Ge-condensation process.

According to some embodiments, an atomic layer deposition process is disclosed for forming a pure GeO$_2$ thin film, in which the process can include alternately and sequentially contacting a substrate with Ge(OCH$_2$CH$_3$)$_4$ and O$_3$.

According to some embodiments, an atomic layer deposition process is disclosed for forming a pure GeO$_2$ thin film, which can include alternately and sequentially contacting a substrate with an alkylamine Ge precursor and an oxygen source. In some embodiments, the Ge precursor is TDMAGe, and the oxygen source is ozone. And in some embodiments, the Ge precursor is TDMAGe, and the oxygen source is water. In some embodiments, the oxygen source is water.

BRIEF DESCRIPTION OF THE DRAWINGS

The invention will be better understood from the Detailed Description and from the appended drawings, which are meant to illustrate and not to limit the invention, and wherein.

DETAILED DESCRIPTION OF PREFERRED EMBODIMENTS

In one aspect, methods of depositing $GeO_2$ thin films by atomic layer deposition are provided. In some embodiments a $GeO_2$ thin film is formed on a substrate by a vapor deposition process comprising alternately and sequentially contacting a substrate with a vapor phase germanium precursor and an oxygen reactant, such that a layer of the germanium precursor forms on the substrate surface, and the oxygen-containing reactant subsequently reacts with the germanium precursor to form a $GeO_2$ thin film.

In some embodiments the Ge precursor may be selected from Germanium ethoxide $(GeOEt)_4$ and tetrakis(dimethylamino) germanium (TDMAGe). Other possible germanium precursors are provided below. In some embodiments the Ge precursor is not a halide. In some embodiments, the Ge precursor contains halide in at least one ligand, but not in all ligands.

In some embodiments the oxygen reactant comprises one or more of ozone, oxygen atoms, oxygen radicals, and oxygen plasma. In some embodiments the oxygen reactant may be water. However, in other embodiments the oxygen reactant is not water.

In some embodiments, $GeO_2$ thin films are deposited by alternately and sequentially contacting a substrate with $Ge(OCH_2CH_3)_4$ and $O_3$. In some embodiments $GeO_2$ thin films are deposited by alternately and sequentially contacting a substrate with tetrakis(dimethylamio) germanium (TDMAGe) and $O_3$.

$GeO_2$ films may be used, for example as an interface layer between high-k and new channel materials in semiconductor devices. For example, the $GeO_2$ layer may serve as an interface in a Ge-based FinFET. In some embodiments the $GeO_2$ layer is an interface layer between Ge and a high-k material. The $GeO_2$ interface layer may prevent leakage and decrease trap density. Other contexts in which $GeO_2$ thin films may be utilized will be apparent to the skilled artisan. For example, $GeO_2$ thin films may find use in optical applications. In some embodiments, the $GeO_2$ films deposited by ALD processes are annealed after the deposition as desired depending on the application.

In one embodiment, the $GeO_2$ films deposited by ALD can be used for a process called Ge-condensation. A principle of this can be seen and understood, for example, from U.S. Patent Publications 2011/0147811 (see FIGS. 3a and 3b) and 2011/0193178 (see para. [0020], which are incorporated by reference herein]). By adding a $GeO_2$ film to the interface of $Si_{1-x}Ge_x/SiO_2$, it may be possible for more Ge to be driven to the fin or channel material. In these cases it is preferable to cap the ALD-deposited $GeO_2$ film with another film (i.e., a "capping layer"), preferably one deposited by ALD or PEALD, such as ALD-deposited or PEALD-deposited $Al_2O_3$, $SiN_x$, or $SiO_2$ before an anneal step where Ge will be driven to the fin or channel. In this application of Ge-condensation, water may be used as an oxygen source in the ALD $GeO_2$ process. In some embodiments, the $GeO_2$ is deposited by an ALD process on a silicon fin without further depositing a capping layer. In some embodiments, the $GeO_2$ is deposited by an ALD process on a $Si_{1-x}Ge_x$ fin without further depositing a capping layer. In some embodiments, the $GeO_2$ is deposited by an ALD process on a silicon fin and a capping layer is deposited over the $GeO_2$ layer. In some embodiments, the $GeO_2$ is deposited by an ALD process on a $Si_{1-x}Ge_x$ fin, and a capping layer is then deposited over the $GeO_2$ layer. In some embodiments, the capping layer is $SiO_2$. In some embodiments, the capping layer is $SiN_x$. In some embodiments, the capping layer is $Al_2O_3$. In some embodiments, the capping layer is deposited by methods other than an ALD or PEALD process. In some embodiments, the capping layer is deposited by an ALD process. In some embodiments the capping layer is deposited by a PEALD process.

In some embodiments the $GeO_2$ films deposited by ALD are pure $GeO_2$ films. Thus, deposited $GeO_2$ may be able to produce a better interface layer than $GeO_2$ formed by thermal oxidation.

Atomic layer deposition allows for conformal deposition of $GeO_2$ films. In some embodiments, the $GeO_2$ films deposited by ALD have at least 90%, 95% or higher conformality. In some embodiments the films are about 100% conformal.

The substrate may be, for example, a semiconductor substrate. In some embodiments the surface of the substrate comprises a group III or group IV compound. For example, in some embodiments the surface of the substrate comprises Ge. In some embodiments the surface of the substrate comprises a thin $GeO_2$ layer. The $GeO_2$ layer may be formed, for example, through thermal or plasma oxidation. In some embodiments the substrate surface is H-terminated. In some embodiments native Ge oxide is removed, for example with HF, prior to $GeO_2$ deposition by ALD.

The substrate may be treated prior to depositing the $GeO_2$ layer by ALD. For example, the substrate may be treated with a passivation chemical to prevent oxidation prior to depositing $GeO_2$ by ALD. In other embodiments the substrate is treated to form an interfacial layer prior to depositing $GeO_2$ by ALD. For example, the substrate treatment may comprise exposing the substrate to trimethylaluminum (TMA) to form an interfacial layer or surface termination on the surface prior to $GeO_2$ deposition. As mentioned above, in some embodiments the substrate may be treated to remove native Ge oxide, for example with HF, prior to depositing $GeO_2$ by ALD.

In some embodiments, following $GeO_2$ deposition, a further film is deposited. The additional film may be directly over and contacting the ALD-deposited $GeO_2$ layer. In some embodiments a high-k film is deposited after the ALD-deposited $GeO_2$ is deposited. The high-k layer or other film may be deposited by ALD or by other known deposition methods. In some embodiments a $HfO_2$ layer is deposited over the $GeO_2$ layer. In some embodiments an $Al_2O_3$ layer is deposited over the $GeO_2$ layer. Without being bound to any particular theory, it is believed that water in the deposition process of the layer deposited on top of a $GeO_2$ layer may cause in some situations the intermixing of the already deposited $GeO_2$ layer and the layer deposited on top of $GeO_2$ layer. In some embodiments this mixing is preferable. In other embodiments, this mixing is to be avoided. Thus, in some embodiments a deposition process for depositing a film on top of a $GeO_2$ film does not utilize water as one of the reactants. In some embodiments a deposition process for depositing a film on top of a $GeO_2$ film utilizes an oxygen source other than water. In some embodiments, a deposition process for a film deposited on top of a $GeO_2$ film uses ozone as an oxygen source. In some embodiments a deposition process for a film deposited on top of a $GeO_2$ film uses oxygen atoms, oxygen radicals or oxygen containing plasma as an oxygen source. In some embodiments, a deposition process for a film deposited on top of a $GeO_2$ film uses water, and at least one mixed layer comprising germanium is produced. When a Ge substrate is used and ozone or oxygen plasma are provided as an oxygen source, atoms or radicals may oxidize the substrate during the first one or more ALD cycles for forming $GeO_2$ and form a thin layer of $GeO_2$ on the substrate itself. In that situation, the $GeO_2$ layer would be a kind of composite of $GeO_2$ (oxidized from substrate) and ALD-deposited $GeO_2$.

In some embodiments a $GeO_2$ layer is an interlayer between a substrate and high-k layer. Preferably a $GeO_2$ interlayer has a thickness of less than about 10 nm, more preferably less than about 5 nm and most preferably less than about 3 nm. In some cases the $GeO_2$ interlayer is less than about 2 nm or even less than about 1 nm thick.

Atomic Layer Deposition (ALD)

As noted above, processes described herein enable use of atomic layer deposition techniques to deposit conformal $GeO_2$ layers. Among vapor deposition techniques, ALD has the advantage of providing high conformality at low temperatures.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. In some embodiments the deposition temperature is from about 20° C. to about 600° C., preferably from about to 100° C. to about 400° C., and more preferably from about 150° C. to about 300° C.

A first germanium reactant is conducted into the chamber in the form of vapor phase pulse and contacted with the surface of a substrate. In some embodiments the substrate surface comprises a three dimensional structure. Conditions are preferably selected such that no more than about one monolayer of the germanium precursor is adsorbed on the substrate surface in a self-limiting manner. Excess first reactant and reaction byproducts, if any, may be removed from the substrate and substrate surface and from proximity to the substrate and substrate surface. In some embodiments reactant and reaction byproducts, if any, may be removed by purging. Purging may be accomplished for example, with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 seconds to about 20 seconds, more preferably between about 1 second and about 10 seconds, and still more preferably between about 1 second and about 2 seconds. However, other purge times can be utilized if necessary, such as when depositing layers over extremely high aspect ratio structures or other structures with complex surface morphology. The appropriate pulsing times can be readily determined by the skilled artisan based on the particular circumstances.

Another method for removing excess reactants—metal precursors or oxygen precursors, reaction byproducts, etc.—from the substrate surface or from the area of the substrate may involve physically moving the substrate from a location containing the reactant and/or reaction byproducts.

A second gaseous oxygen reactant is pulsed into the chamber where it reacts with the first germanium reactant on the surface to form germanium oxide. Excess second reactant and gaseous by-products of the surface reaction are removed from the substrate, for example by purging them out of the reaction chamber, preferably with the aid of an inert gas. The steps of pulsing and removing are repeated until a thin film of the desired thickness has been formed on the substrate, with each cycle typically leaving no more than about a molecular monolayer.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

In some embodiments, a reaction space can be in a single-wafer ALD reactor or a batch ALD reactor where deposition on multiple substrates takes place at the same time. In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Examples of suitable reactors that may be used include commercially available ALD equipment such as the F-120® reactor, F-450 reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible.

Suitable batch reactors include, but are not limited to, reactors designed specifically to enhance ALD processes, which are commercially available from and ASM Europe B.V (Almere, Netherlands) under the trade names ALDA400™ and A412™. In some embodiments a vertical batch reactor is utilized in which the boat rotates during processing, such as the A412™. Thus, in some embodiments the wafers rotate during processing. In some embodiments in which a batch reactor is used, wafer-to-wafer uniformity is less than 3% (1 sigma), less than 2%, less than 1% or even less than 0.5%.

The germanium oxide ALD processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

According to some embodiments, a germanium oxide thin film is formed by an ALD-type process comprising multiple pulsing cycles, each cycle comprising:
  pulsing a vaporized first Ge precursor into the reaction chamber to form at most a molecular monolayer of the Ge precursor on the substrate,
  removing excess Ge precursor and reaction by products, if any,
  providing a pulse of a second oxygen reactant comprising an oxygen source onto the substrate,
  removing excess second reactant and any gaseous by-products formed in the reaction between the Ge precursor layer on the first surface of the substrate and the second reactant, and
  repeating the pulsing and removing steps until a germanium oxide thin film of the desired thickness has been formed.

In some embodiments germanium oxide, preferably $GeO_2$, is deposited from alternating and sequential pulses of a Ge precursor and an oxygen source, like water, ozone, oxygen plasma, oxygen radicals, or oxygen atoms. In some embodiments the oxygen source is not water. The Ge precursor preferably comprises $Ge(OEt)_4$ or TDMAGe.

The Ge precursor employed in the ALD type processes may be solid, liquid, or gaseous material under standard conditions (room temperature and atmospheric pressure), provided that the Ge precursor is in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 seconds to about 10 seconds. However, depending on the substrate type and its surface area, the pulsing time may be even higher than about 10 seconds.

Preferably, for a 300 mm wafer in a single wafer ALD reactor, the Ge precursor is pulsed for from about 0.05 seconds to about 10 seconds, more preferably for from about 0.1 seconds to about 5 seconds and most preferably for from about 0.3 seconds to about 3.0 seconds. The oxygen-containing precursor is preferably pulsed for from about 0.05 seconds to about 10 seconds, more preferably for from about 0.1 seconds to about 5 seconds, most preferably for from about 0.2 seconds to about 3.0 seconds. However, pulsing times can be on the order of minutes in some cases. The optimum pulsing time can be readily determined by the skilled artisan based on the particular circumstances.

As mentioned above, in some embodiments the Ge precursor is $Ge(OEt)_4$ or TDMAGe. Other possible germanium precursors that can be used in some embodiments are described below. In some embodiments, the Ge precursor is $Ge(OMe)_4$. In some embodiments the Ge-precursor is not a halide. In some embodiments the Ge-precursor may comprise a halogen in at least one ligand, but not in all ligands.

The oxygen source may be an oxygen-containing gas pulse and can be a mixture of oxygen and inactive gas, such as nitrogen or argon. In some embodiments the oxygen source may be a molecular oxygen-containing gas pulse. The preferred oxygen content of the oxygen-source gas is from about 10% to about 25%. Thus, one source of oxygen may be air. In some embodiments, the oxygen source is molecular oxygen. In some embodiments, the oxygen source comprises an activated or excited oxygen species. In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen source is oxygen plasma.

In some embodiments, ozone or a mixture of ozone and another gas is pulsed into the reaction chamber. In other embodiments, ozone is formed inside the reactor, for example by conducting oxygen containing gas through an arc. In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma, the pathway to the substrate can be optimized to maximize electrically neutral species and minimize ion survival before reaching the substrate.

In some embodiments the oxygen source is an oxygen source other than water. Thus, in some embodiments water is not provided in any ALD cycle for depositing $GeO_2$.

In some embodiments the Ge precursor comprises at least one amine or alkylamine ligand, such as those presented in formulas (2) through (6) and (8) and (9), and the oxygen precursor comprises water.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on.

The processing time depends on the thickness of the layer to be produced and the growth rate of the film. In ALD, the growth rate of a thin film is determined as thickness increase per one cycle. One cycle consists of the pulsing and removing steps of the precursors and the duration of one cycle is typically between about 0.2 seconds and about 30 seconds, more preferably between about 1 second and about 10 seconds, but it can be on order of minutes or more in some cases, for example, where large surface areas and volumes are present.

In some embodiments the $GeO_2$ film formed is a pure $GeO_2$ film. Preferably, aside from minor impurities no other metal or semi-metal elements are present in the film. In some embodiments the film comprises less than 1-at % of metal or semi-metal other than Ge. In some embodiments the $GeO_2$ film is stoichiometric. In some embodiments, a pure $GeO_2$ film comprises less than about 5-at % of any impurity other than hydrogen, preferably less than about 3-at % of any impurity other than hydrogen, and more preferably less than about 1-at % of any impurity other than hydrogen.

In some embodiments, the $GeO_2$ film formed has step coverage of more than about 80%, more preferably more than about 90%, and most preferably more than about 95% in structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

Ge Precursors

A number of different Ge precursors can be used in the ALD processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. In some embodiments, the Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

In some embodiments the Ge precursor is not solid at room temperature (e.g., about 20° C.).

For example, Ge precursors from formulas (1) through (9) below may be used in some embodiments.

$$GeOR_4 \tag{1}$$

Wherein R is can be independently selected from the group consisting of alkyl and substituted alkyl;

$$GeR_xA_{4-x} \tag{2}$$

Wherein the x is an integer from 1 to 4;
R is an organic ligand and can be independently selected from the group consisting of alkoxides, alkylsilyls, alkyl, substituted alkyl, alkylamines; and
A can be independently selected from the group consisting of alkyl, substituted alkyl, alkoxides, alkylsilyls, alkyl, alkylamines, halide, and hydrogen.

$$Ge(OR)_xA_{4-x} \tag{3}$$

Wherein the x is an integer from 1 to 4;
R can be independently selected from the group consisting of alkyl and substituted alkyl; and
A can be independently selected from the group consisting of alkyl, alkoxides, alkylsilyls, alkyl, substituted alkyl, alkylamines, halide, and hydrogen.

$$Ge(NR^IR^{II})_4 \tag{4}$$

Wherein $R^I$ can be independently selected from the group consisting of hydrogen, alkyl and substituted alkyl; and
$R^{II}$ can be independently selected from the group consisting of alkyl and substituted alkyl;

$$Ge(NR^IR^{II})_xA_{4-x} \tag{5}$$

Wherein the x is an integer from 1 to 4;
$R^I$ can be independently selected from the group consisting of hydrogen, alkyl and substituted alkyl; and
$R^{II}$ can be independently selected from the group consisting of alkyl and substituted alkyl;
A can be independently selected from the group consisting of alkyl, alkoxides, alkylsilyls, alkyl, substituted alkyl, alkylamines, halide, and hydrogen.

$$Ge_n(NR^IR^{II})_{2n+2} \tag{6}$$

Wherein the n is an integer from 1 to 3;
$R^I$ can be independently selected from the group consisting of hydrogen, alkyl and substituted alkyl; and
$R^{II}$ can be independently selected from the group consisting of alkyl and substituted alkyl;

$$Ge_n(OR)_{2n+2} \tag{7}$$

Wherein the n is an integer from 1 to 3; and
Wherein R can be independently selected from the group consisting of alkyl and substituted alkyl;

$$Ge_nR_{2n+2} \tag{8}$$

Wherein the n is an integer from 1 to 3; and
R is an organic ligand and can be independently selected from the group consisting of alkoxides, alkylsilyls, alkyl, substituted alkyl, alkylamines.

$$A_{3-x}R_xGe-GeR_yA_{3-y} \tag{9}$$

Wherein the x is an integer from 1 to 3;
y is an integer from 1 to 3;
R is an organic ligand and can be independently selected from the group consisting of alkoxides, alkylsilyls, alkyl, substituted alkyl, alkylamines; and
A can be independently selected from the group consisting of alkyl, alkoxides, alkylsilyls, alkyl, substituted alkyl, alkylamines, halide, and hydrogen.

Preferred options for R include, but are not limited to, methyl, ethyl, propyl, isopropyl, n-butyl, isobutyl, tertbutyl for all formulas, more preferred in ethyl and methyl. In some embodiments, the preferred options for R include, but are not limited to, $C_3$-$C_{10}$ alkyls, alkenyls, and alkynyls and substituted versions of those, more preferably $C_3$-$C_6$ alkyls, alkenyls, and alkenyls and substituted versions of those.

In some embodiments the Ge precursor comprises one or more halides. Preferably the precursor comprises 1, 2, or 3 halide ligands. However, as mentioned above, in some embodiments the Ge precursor used in the ALD process does not comprise a halide.

In some embodiments, a Ge precursor that comprises an alkoxide is not used in combination with water in an ALD process. In other embodiments, an amine/alkylyamine or Ge—N bond containing Ge precursor may be used in combination with water. Preferred alkylamine Ge precursors include, but are not limited to, tetrakis(dimethylamino) germanium (TDMAGe), tetrakis(diethylamino) germanium (TDEAGe), and tetrakis(ethylmethylamino) germanium (TEMAGe). In some embodiments the Ge precursor is TDMAGe. In some embodiments the precursor is TDEAGe. In some embodiments the precursor is TEMAGe.

EXAMPLES $GeO_2$ films were deposited in an F-450 ALCVD R&D reactor at temperatures ranging from about 150° C. to about 300° C. using germanium ethoxide ($Ge(OEt)_4$) or tetrakis (dimethylamino) germanium (TDMAGe) as the Ge precursor, and ozone ($O_3$) as the oxygen source. $Ge(OEt)_4$ is a liquid with a vapor pressure of about 0.2 Torr at 55° C. TDMAGe is a liquid with a vapor pressure of about 3 Torr at 50° C. Pulse/purge times were 3.0 s/6.0 s for all precursors Ge $(OEt)_4$, TDMAGe and $O_3$. In these deposition experiments the Ge precursor was held at room temperature. The $O_3$ flow rate was 100 sccm. Film thicknesses were measured using a spectroscopic ellipsometer and x-ray diffraction XRR (Broker AXS D8 Advance). Composition was determined by Rurherford backscattering spectroscopy RBS.

Figure 1:
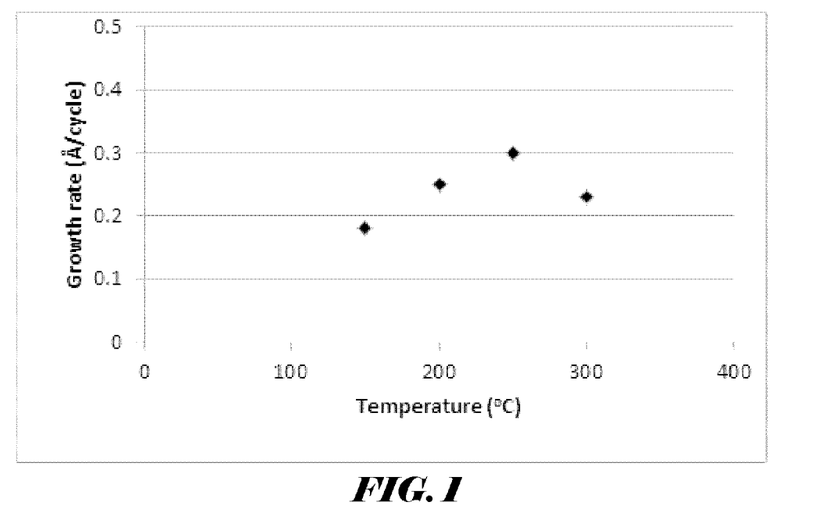
FIG. 1 illustrates the growth rate of GeO$_2$ films as a function of deposition temperature using vapour pulses of Ge(OEt)$_4$ and O$_3$ at 150° C.-300° C.
Figure 2:
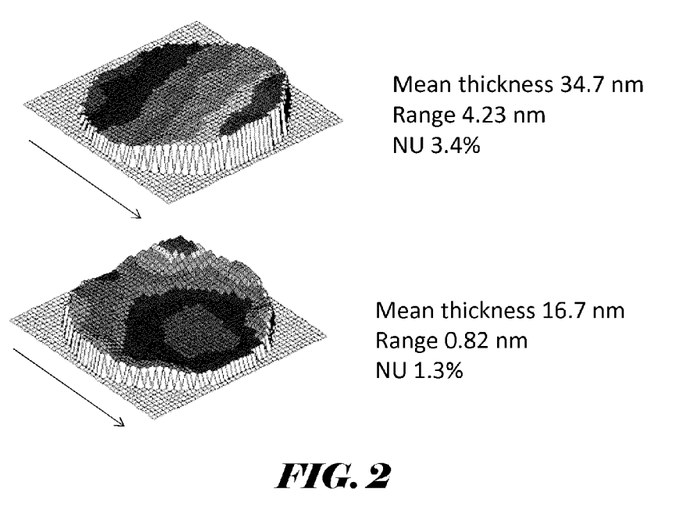
FIG. 2 illustrates two computerized images of the respective thicknesses of two wafers prepared according to some embodiments.

In one set of experiments, $GeO_2$ films were deposited by alternately and sequentially contacting a substrate in a reactor chamber with vapor pulses of $Ge(OEt)_4$ and $O_3$ at about 150° C. to about 300° C. In this temperature range growth rate of about 0.18 Å/cycle to about 0.3 Å/cycle was obtained (FIG. 1).

Figure 3:
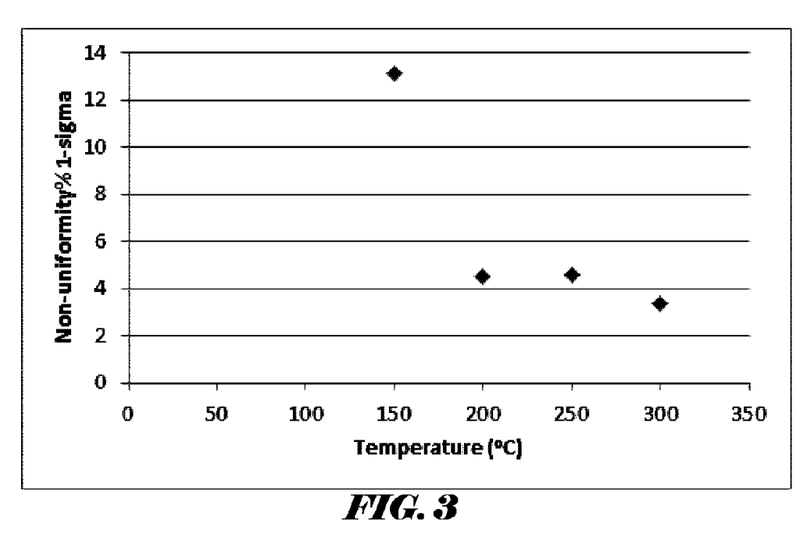
FIG. 3 illustrates GeO$_2$ film thickness non-uniformity as a function of deposition temperature using vapour pulses of Ge(OEt)$_4$ and O$_3$ at 150° C.-300° C.
Figure 4:
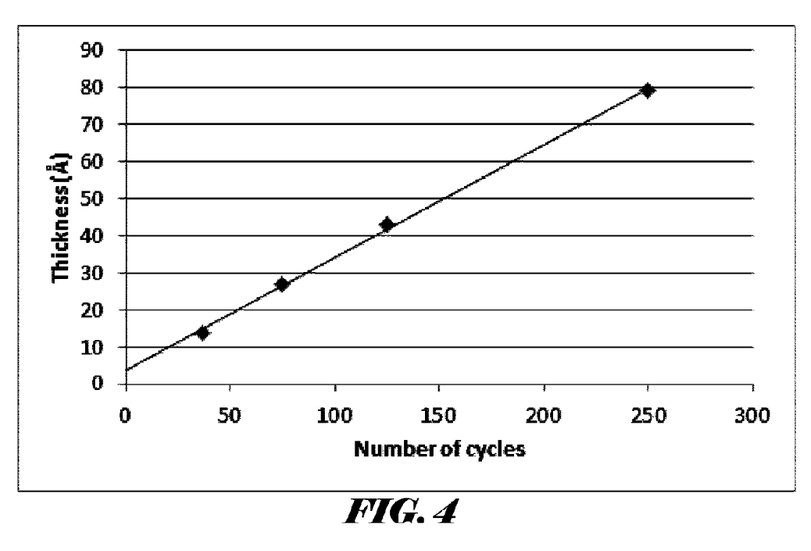
FIG. 4 illustrates GeO$_2$ film thickness as a function of the number of deposition cycles when using vapour pulses of Ge(OEt)$_4$ and O$_3$ at 250° C.

In the same temperature range of 150° C. to 300° C. the thickness non-uniformity was about 3% to about 13% 1-sigma, and the lowest non-uniformities were obtained at 300° C. (FIG. 3). A series of films of various thicknesses were deposited at 250° C. by varying cycle number. Film growth was linear, i.e. film thickness can be controlled by the number of cycles (FIG. 4). Thinner films were also deposited at 300° C. Between about 150° C. and about 300° C., the $GeO_2$ film density was about 3.8 g/cm³ to about 4 g/cm³ (from XRR; bulk 4.23 g/cm³). In particular, at 250° C. the growth rate was about 0.25 Å/cycle and the film had a non-uniformity of less than about 10%. The XRR density at 250° C. was about 4.35 g/cm³ (bulk 4.23 g/cm3), and the refractive index was modeled to be close to the bulk value from ellipsometer data (bulk 1.650 vs. modeled 1.66).

Figure 5:
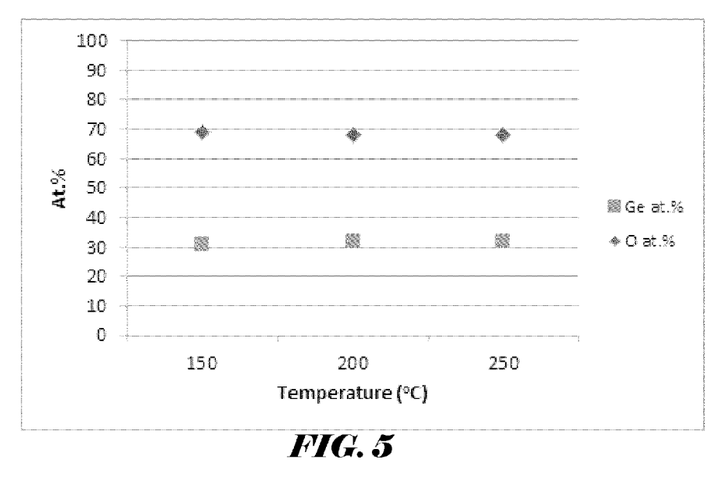
FIG. 5 shows the composition of GeO$_2$ deposited by ALD at various temperatures.

In the temperature range of 150° C. to 250° C., the composition of these films was about 32-at % Ge and about 68-at % O (RBS analysis of about 50 nm $GeO_2$ on silicon with native oxide). See FIG. 5.

Electrical results (capacitance-voltage i.e. C-V) of $GeO_2$ films deposited by ALD on Ge-substrates (both n- and p-type) using vapor pulses of $Ge(OEt)_4$ and $O_3$ can be seen in FIG. 11 through FIG. 14B. In some samples, $GeO_2$ ALD deposition was followed by $Al_2O_3$ ALD film deposition using TMA as aluminum source and ozone or water as oxygen source. It can be concluded from the electrical results that a $GeO_2$ interlayer deposited by ALD provides good electrical properties including low Dit (interfacial traps) and Dbt (border traps), as well as small CV hysteresis for capacitors on p-Ge. Promising performance can thus be expected for transistors. No electrical degradation was found when ALD-deposited $GeO_2$ interlayer thickness was reduced from about 5 nm to about 2.2 nm. It also can be concluded that the k value of ALD-deposited $GeO_2$ is about 5.7. An ALD-deposited $Al_2O_3$ capping layer is preferable in some situations. Native Ge oxide can also be removed prior to the $GeO_2$ ALD deposition. Better performance was also observed for ALD-deposited $GeO_2$ interlayers grown at 250° C. compared to 300° C.

Figure 7A:
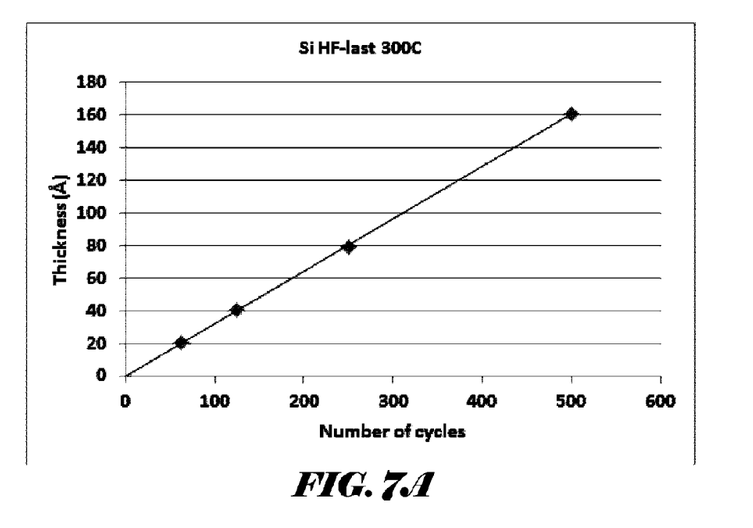
FIG. 7A illustrates GeO$_2$ film thickness as a function of the number of deposition cycles when using vapour pulses of Ge(OEt)$_4$ and O$_3$ at 300° C. on HF-last Si.
Figure 7B:
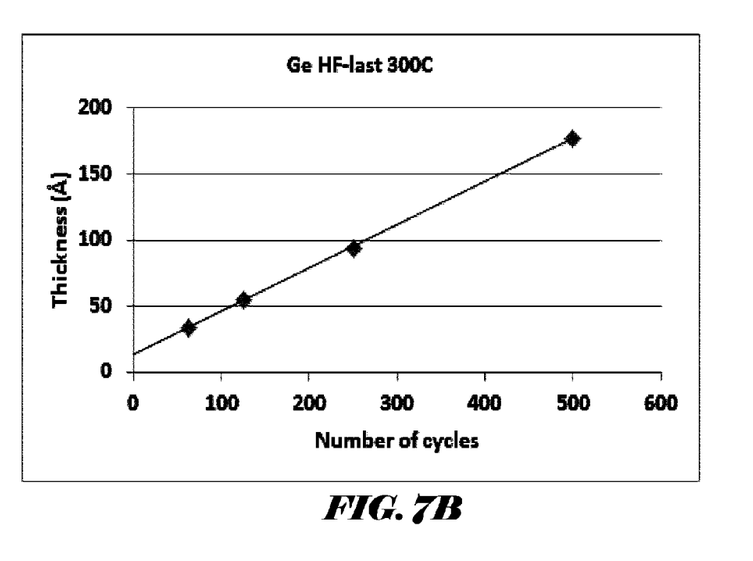
FIG. 7B illustrates GeO$_2$ film thickness as a function of the number of deposition cycles when using vapour pulses of Ge(OEt)$_4$ and O$_3$ at 300° C. on HF-last Ge.

In FIGS. 7A and 7B it can be seen that $GeO_2$ deposited by ALD grows linearly on HF-last Ge (FIG. 7B) and on HF-last Si (FIG. 7A) when using vapor pulses of $Ge(OEt)_4$ and $O_3$ at 300° C.

Figure 8A:
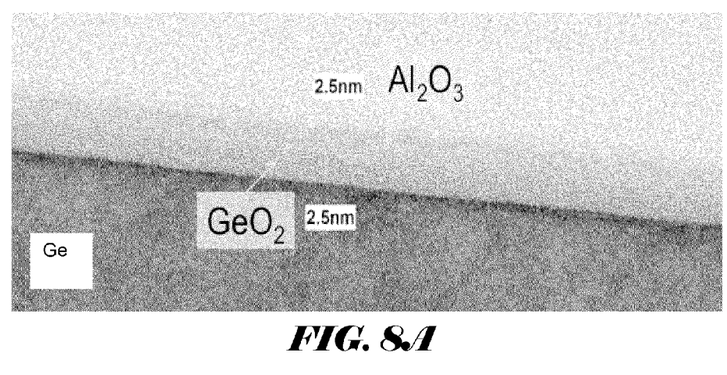
FIG. 8A shows a transmission electron microscope (TEM) image of two layers deposited by ALD (GeO$_2$ and Al$_2$O$_3$) where the Al$_2$O$_3$ was deposited using a TMA+O$_3$−process.
Figure 8B:
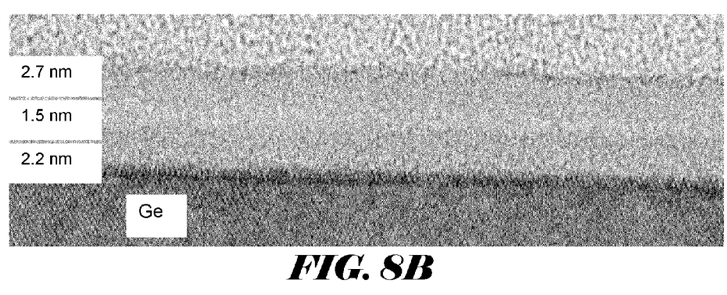
FIG. 8B shows a TEM image of three intermixed layers (Al, Ge, and O) when Al$_2$O$_3$ was deposited using a TMA+H$_2$O process.

FIGS. 8A and 8B show TEM images of an ALD $Al_2O_3$/ ALD $GeO_2$ (37 cycles)/Ge/Si—stack/structure. $Al_2O_3$ was deposited by ALD using vapor pulses or TMA and water or ozone. As can been seen from FIG. 8B, layers can mix when using water as an oxygen source in the $Al_2O_3$ ALD process, whereas when using ozone as the oxygen source in the $Al_2O_3$ ALD process, two clearly separated layers can be seen in FIG. 8A. However, the reason for intermixing of the layers is unsure, and it may be caused by the electron beam in the analysis.

Figure 9A:
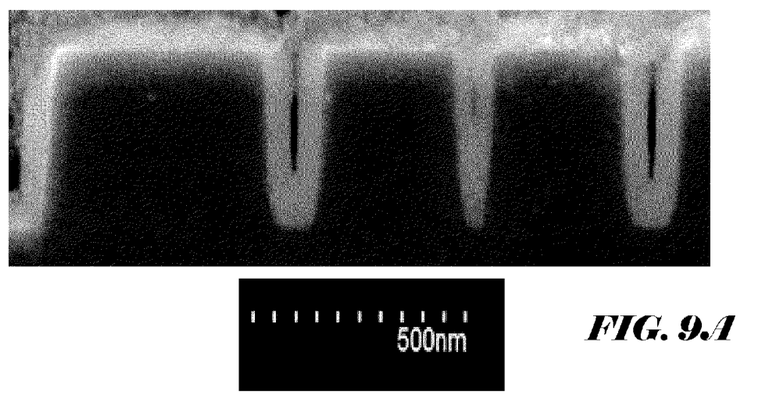
FIG. 9A shows an image from a scanning electron microscope (SEM) at a first magnification illustrating $GeO_2$ film conformality when deposited using vapour pulses of $Ge(OEt)_4$ and $O_3$.
Figure 9B:
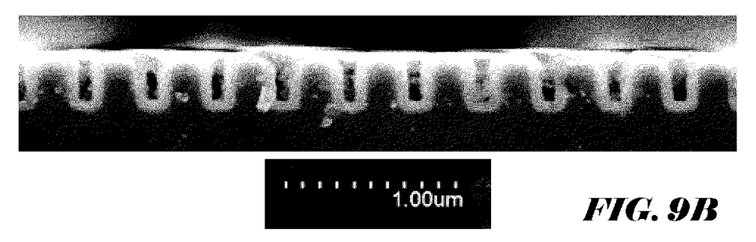
FIG. 9B shows an image from a SEM at a second magnification illustrating $GeO_2$ film conformality when deposited using vapour pulses of $Ge(OEt)_4$ and $O_3$.
Figure 10:
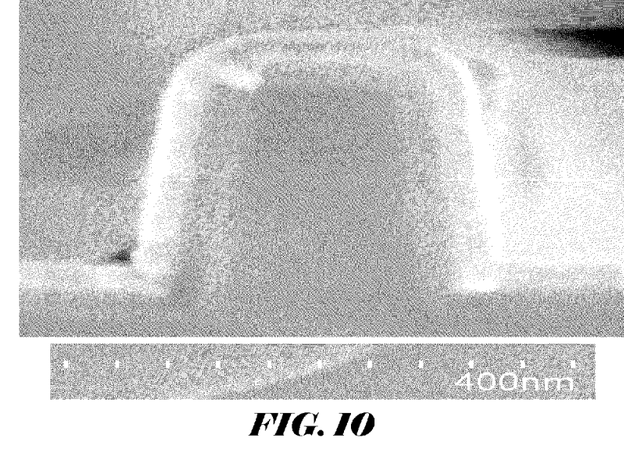
FIG. 10 illustrates ALD $GeO_2$/ALD $HfO_2$ stack film conformality when grown at reaction temperature of 250° C. The target thickness of the $GeO_2$ was about 30 nm.
Figure 11:
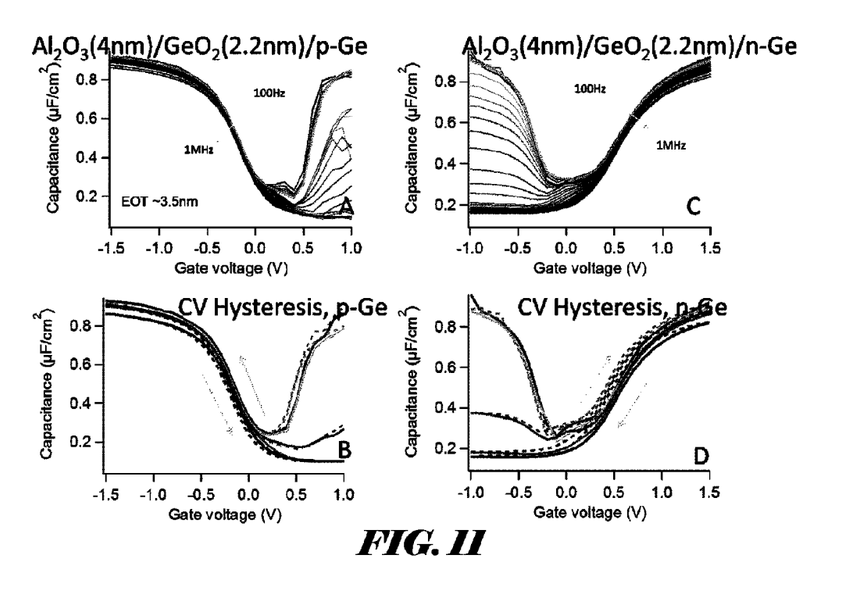
FIG. 11 illustrates the C-V characteristics of ALD $GeO_2$ interlayers grown on p-doped Ge and n-doped Ge. The $GeO_2$ interlayers were grown at a reaction temperature 250° C. from vapour pulses of $Ge(OEt)_4$ and $O_3$.
Figure 12:
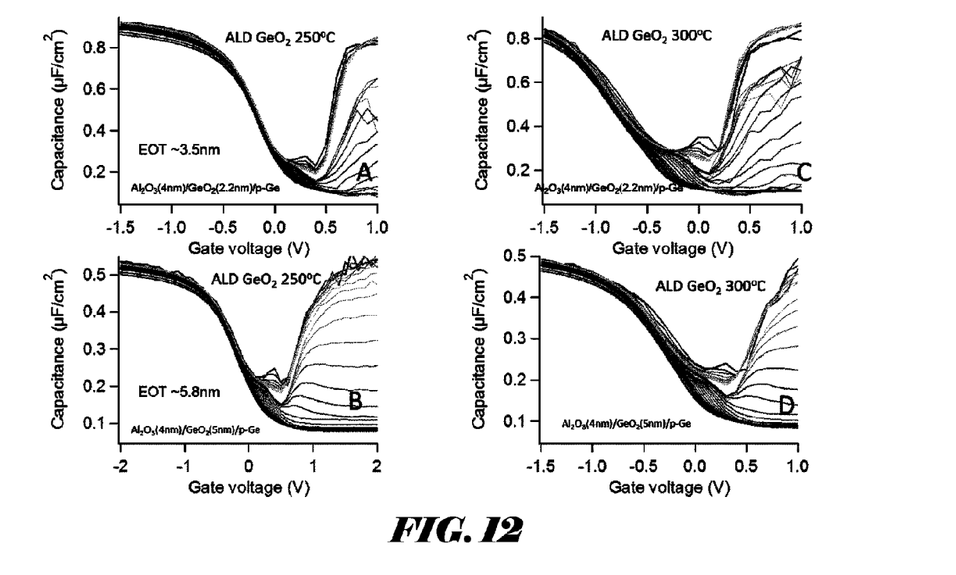
FIG. 12 illustrates the C-V characteristics of $GeO_2$ interlayer grown by ALD at different temperatures using vapour pulses of $Ge(OEt)_4$ and $O_3$.
Figure 13A:
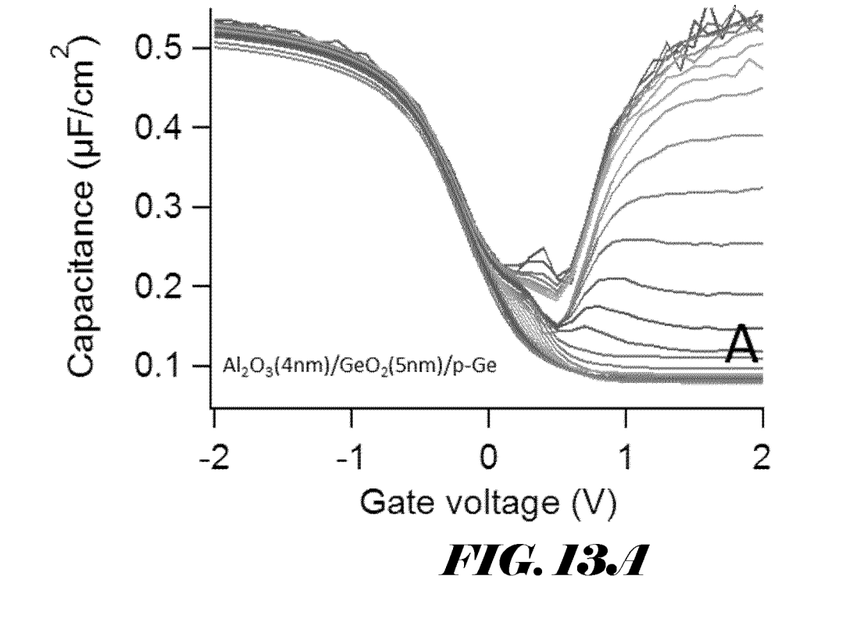
FIG. 13A illustrates the C-V characteristics of $GeO_2$ interlayers, grown by ALD at a reaction temperature of 250° C. using vapour pulses of $Ge(OEt)_4$ and $O_3$ with an ALD $Al_2O_3$ capping layer.
Figure 13B:
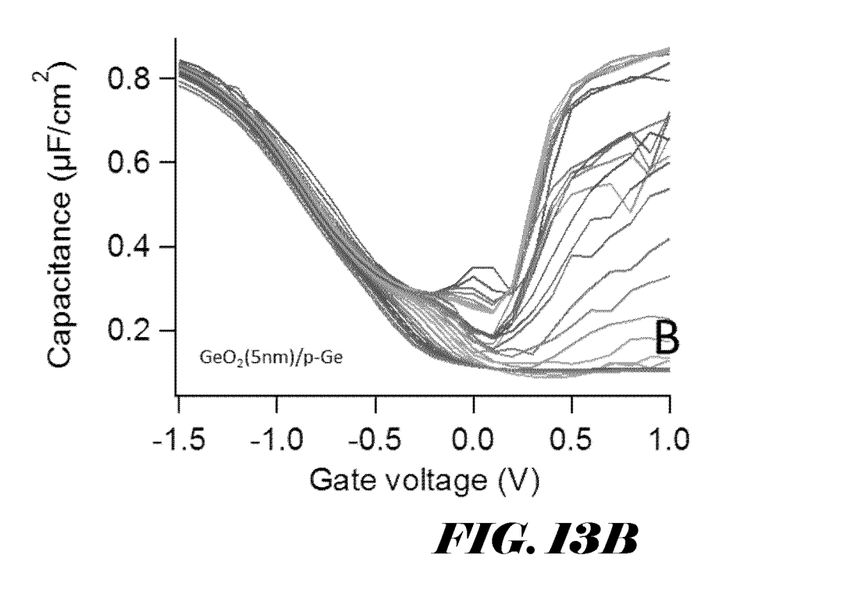
FIG. 13B illustrates the C-V characteristics of $GeO_2$ interlayers, grown by ALD at a reaction temperature of 250° C. using vapour pulses of $Ge(OEt)_4$ and $O_3$ without an ALD $Al_2O_3$ capping layer.
Figure 14A:
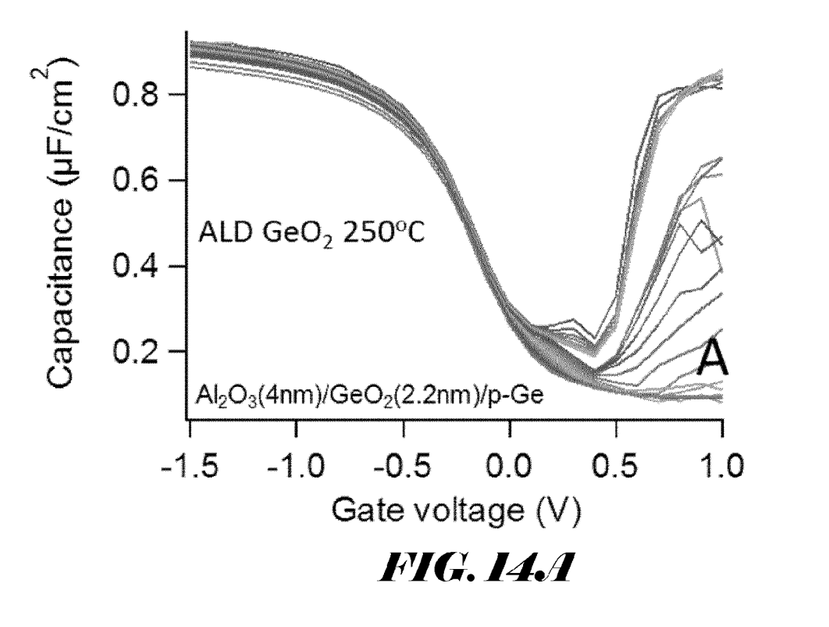
FIG. 14A illustrates the C-V characteristics of $GeO_2$ interlayers grown by ALD on Ge-substrates with HF-cleaning, at a reaction temperature 250° C. using vapour pulses of $Ge(OEt)_4$ and $O_3$.
Figure 14B:
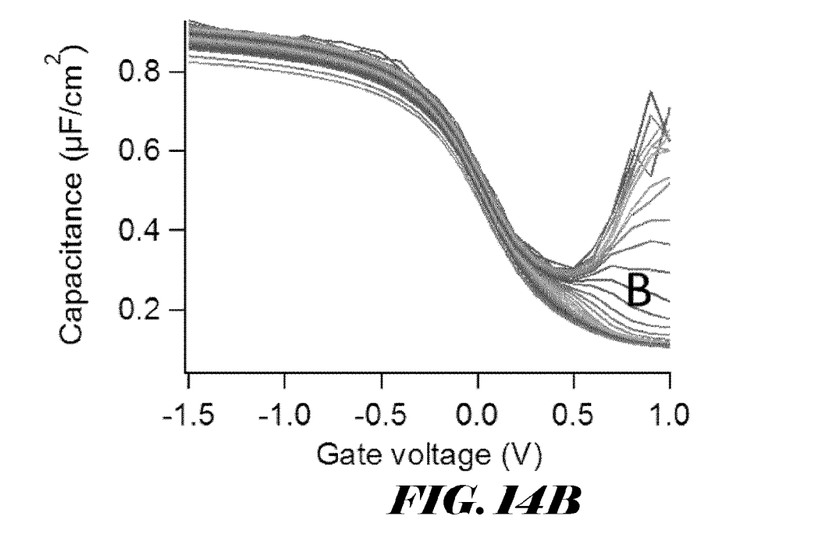
FIG. 14B illustrates the C-V characteristics of $GeO_2$ interlayers grown by ALD on Ge-substrates without HF-cleaning, at a reaction temperature 250° C. using vapour pulses of $Ge(OEt)_4$ and $O_3$.

Good conformality can be obtained when depositing $GeO_2$ by ALD using vapor pulses of $Ge(OEt)_4$ and $O_3$ as can be seen in FIGS. 9A and 9B and in FIG. 10, which illustrates ALD $GeO_2$/ALD $HfO_2$ stack film conformality when grown at a reaction temperature of 250° C. and using a target $GeO_2$ thickness of about 30 nm.

In another set of experiments, $GeO_2$ films were deposited by alternately and sequentially contacting a substrate in a reactor chamber with vapor pulses of tetrakis(dimethylamino)germanium (TDMAGe) and $O_3$ at 150° C. to 300° C. In this temperature range growth rate of about 0.4 Å/cycle to about 0.55 Å/cycle was obtained. In the same temperature range of 150° C. to 300° C., the thickness non-uniformity was less than about 6%. The best nonuniformity of less than about 2% was observed at about 200° C. In the 150° C. to 300° C. range, the $GeO_2$ film density was about 3.8 g/cm³ to about 4 g/cm³ (from XRR). The EDX composition was about 30 at. % Ge and about 70 at. % O. TDMAGe was also observed to react with water.

Figure 6A:
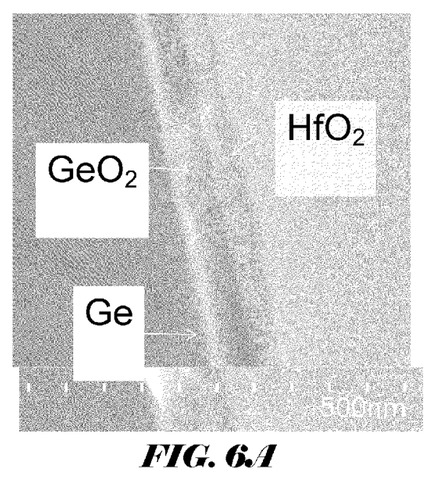
FIG. 6A shows GeO$_2$ films deposited by ALD over Ge at a first magnification. HfO$_2$ was subsequently deposited over the GeO$_2$.
Figure 6B:
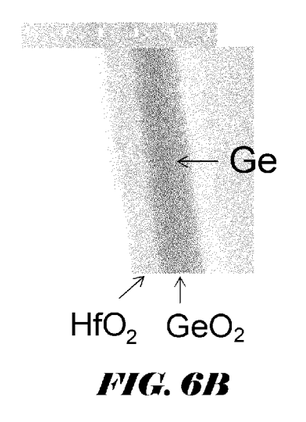
FIG. 6B shows GeO$_2$ films deposited by ALD over Ge at a second magnification. HfO$_2$ was subsequently deposited over the GeO$_2$.

$GeO_2$ was also deposited on a Ge surface and topped with $HfO_2$. Briefly, 50 nm of $GeO_2$ was deposited from TDMAGe and $O_3$ by ALD, as described herein, on a substrate comprising either 15 nm or 1 μm Ge on Si. Subsequently, approximately 50 nm of $HfO_2$ was deposited over the $GeO_2$ by atomic layer deposition using alternating and sequential pulses of $HfCl_4$ and $H_2O$. The deposition temperature was 300° C. No etching was observed. The results are shown in FIGS. 6A and 6B.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. An atomic layer deposition process for forming a germanium oxide thin film on a substrate in a reaction chamber, the ALD process comprising:
   contacting the substrate with a vapor phase tetravalent Ge precursor such that at most a molecular monolayer of the Ge precursor is formed on the substrate surface,
   removing excess Ge precursor and reaction by products, if any,
   contacting the substrate with a vapor phase oxygen precursor, wherein the oxygen precursor reacts with the Ge precursor on the substrate surface;
   removing excess oxygen precursor and any gaseous by-products, and
   repeating the contacting and removing steps multiple times until a germanium oxide thin film comprising less than about 1-at % of metal or semi-metal other than Ge of the desired thickness has been formed;

wherein the Ge precursor has a formula as in one of the following general formulas:

$$GeOR_4 \quad (1)$$

Wherein R can be independently selected from the group consisting of alkyl and substituted alkyl;

$$GeR_xA_{4-x} \quad (2)$$

Wherein the x is an integer from 1 to 4;
R is an organic ligand and can be independently selected from the group consisting of alkoxides, alkylsilyls, alkyl, substituted alkyl, alkylamines; and
A can be independently selected from the group consisting of alkyl, substituted alkyl, alkoxides, alkylsilyls, alkyl, alkylamines, halide, and hydrogen;

$$Ge(OR)_xA_{4-x} \quad (3)$$

Wherein the x is an integer from 1 to 4;
R can be independently selected from the group consisting of alkyl and substituted alkyl; and
A can be independently selected from the group consisting of alkyl, alkoxides, alkylsilyls, alkyl, substituted alkyl, alkylamines, halide, and hydrogen;

$$Ge(NR^{I}R^{II})_4 \quad (4)$$

Wherein $R^{I}$ can be independently selected from the group consisting of hydrogen, alkyl and substituted alkyl; and
$R^{II}$ can be independently selected from the group consisting of alkyl and substituted alkyl;

$$Ge(NR^{I}R^{II})_xA_{4-x} \quad (5)$$

Wherein the x is an integer from 1 to 4;
$R^{I}$ can be independently selected from the group consisting of hydrogen, alkyl and substituted alkyl;
$R^{II}$ can be independently selected from the group consisting of alkyl and substituted alkyl; and
A can be independently selected from the group consisting of alkyl, alkoxides, alkylsilyls, alkyl, substituted alkyl, alkylamines, halide, and hydrogen;

$$Ge_n(NR^{I}R^{II})_{2n+2} \quad (6)$$

Wherein the n is an integer from 1 to 3;
$R^{I}$ can be independently selected from the group consisting of hydrogen, alkyl and substituted alkyl; and
$R^{II}$ can be independently selected from the group consisting of alkyl and substituted alkyl;

$$Ge_n(OR)_{2n+2} \quad (7)$$

Wherein the n is an integer from 1 to 3; and
Wherein R can be independently selected from the group consisting of alkyl and substituted alkyl;

$$Ge_nR_{2n+2} \quad (8)$$

Wherein the n is an integer from 1 to 3; and
R is an organic ligand and can be independently selected from the group consisting of alkoxides, alkylsilyls, alkyl, substituted alkyl, alkylamines;

$$A_{3-x}R_xGe-GeR_yA_{3-y} \quad (9)$$

Wherein the x is an integer from 1 to 3;
y is an integer from 1 to 3;

R is an organic ligand and can be independently selected from the group consisting of alkoxides, alkylsilyls, alkyl, substituted alkyl, alkylamines; and
A can be independently selected from the group consisting of alkyl, alkoxides, alkylsilyls, alkyl, substituted alkyl, alkylamines, halide, and hydrogen.

2. The process of claim 1, wherein removing excess Ge precursor comprises removing excess Ge precursor from the substrate surface and in proximity to the substrate surface.

3. The process of claim 1, wherein the oxygen precursor is other than water.

4. The process of claim 1, wherein the oxygen precursor is ozone, oxygen atoms, oxygen radicals, or oxygen plasma.

5. The process of claim 1, wherein the Ge-precursor is not a halide.

6. The process of claim 1, wherein the Ge-precursor comprises at least one alkoxide ligand.

7. The process of claim 1, wherein the Ge-precursor comprises at least one amine or alkylamine ligand.

8. The process of claim 1, wherein the Ge-precursor comprises at least one amine or alkylamine ligand, and the oxygen precursor comprises water.

9. The process of claim 1, wherein the surface of the substrate comprises a thin layer of $GeO_2$ prior to beginning the ALD process.

10. The process of claim 1, wherein the substrate is pretreated with a passivation chemical to prevent oxidation before the germanium oxide thin film is deposited.

11. The process of claim 1, further comprising depositing a thin layer of a different material over the germanium oxide thin film.

12. The process of claim 11, wherein the thin layer comprises $Al_2O_3$.

13. The process of claim 1, wherein the germanium oxide layer serves as an interlayer between the substrate and a high-k layer.

14. The process of claim 1, wherein the germanium oxide thin film is used in a Ge-condensation process.

15. An atomic layer deposition process for forming a $GeO_2$ thin film comprising less than about 1-at % of metal or semimetal other than Ge, comprising two or more deposition cycles, wherein at least two sequential deposition cycles form germanium oxide and comprise alternately and sequentially contacting a substrate with $Ge(OCH_2CH_3)_4$ and $O_3$.

16. An atomic layer deposition process for forming a $GeO_2$ thin film comprising less than about 1-at % of metal or semimetal other than Ge, comprising two or more deposition cycles, wherein at least two sequential deposition cycles form germanium oxide and comprise alternately and sequentially contacting a substrate with an alkylamine Ge precursor that does not comprise a halide and an oxygen source.

17. The process of claim 16, wherein the Ge precursor is TDMAGe, and the oxygen source is ozone.

18. The process of claim 16, wherein the Ge precursor is TDMAGe, and the oxygen source is water.

19. The process of claim 16, wherein the oxygen source is water.

* * * * *

UNITED STATES PATENT AND TRADEMARK OFFICE
CERTIFICATE OF CORRECTION

PATENT NO. : 9,171,715 B2
APPLICATION NO. : 13/802393
DATED : October 27, 2015
INVENTOR(S) : Raija H. Matero It is certified that error appears in the above-identified patent and that said Letters Patent is hereby corrected as shown below:

In the Specification

In column 3 at line 63, Change "(dimethylamio)" to --(dimethylamino)--.

In column 4 at line 21, Change "$SiN_X$," to --$SiN_x$,--.

In column 4 at line 35, Change "$SiN_X$." to --$SiN_x$.--.

In column 10 at line 64, Change "alkylyamine" to --alkylamine--.

In column 11 at line 23, Change "Rurherford" to --Rutherford--.

In column 11, at line 42, Change "g/cm3)," to --$g/cm^3$),--.

In the Claims

In column 13 at line 5, In Claim 1, change "Wherein" to --wherein--.

In column 13 at line 8, In Claim 1, change "Wherein" to --wherein--.

In column 13 at line 17, In Claim 1, change "Wherein" to --wherein--.

In column 13 at line 25, In Claim 1, change "Wherein $R^{II}$" to --wherein $R^I$--.

In column 13 at line 30 (approx.), In Claim 1, change "Wherein" to --wherein--.

In column 13 at line 31 (approx.), In Claim 1, change "$R^I$can" to --$R^I$ can--.

In column 13 at line 40 (approx.), In Claim 1, change "Wherein" to --wherein--.

In column 13 at line 47 (approx.), In Claim 1, change "Wherein" to --wherein--.

In column 13 at line 48 (approx.), In Claim 1, delete "Wherein".

In column 13 at line 51 (approx.), In Claim 1, change "Wherein" to --wherein--.

In column 13 at line 57 (approx.), In Claim 1, change "Wherein" to --wherein--.

Signed and Sealed this
Ninth Day of August, 2016

Michelle K. Lee
*Director of the United States Patent and Trademark Office*